United States Patent [19]

Amir et al.

[11] Patent Number: 4,521,907
[45] Date of Patent: Jun. 4, 1985

[54] MULTIPLIER/ADDER CIRCUIT

[75] Inventors: Gideon Amir, San Jose; Roubik Gregorian, Santa Clara, both of Calif.

[73] Assignee: American Microsystems, Incorporated, Santa Clara, Calif.

[21] Appl. No.: 381,807

[22] Filed: May 25, 1982

[51] Int. Cl.³ .............................................. G10L 1/00
[52] U.S. Cl. ............................... 381/47; 340/347 CC; 375/34
[58] Field of Search .................. 381/47; 364/724, 825; 340/347 CC, 347 AD; 375/26, 34

[56] References Cited

U.S. PATENT DOCUMENTS 3,940,759  2/1976  Zitelli et al. .................. 340/347 CC Primary Examiner—E. S. Matt Kemeny
Attorney, Agent, or Firm—Steven F. Caserza; Alan H. MacPherson

[57] ABSTRACT

In one embodiment of this invention, a uniquely designed switched capacitor multiplier/adder (129) is provided which also functions as a digital-to-analog converter in a single subcircuit. The multiplier/adder, in a single operation, multiplies an analog voltage by a binary coefficient, and sums this product with a second analog voltage. The use of this unique subcircuit significantly reduces the space requirements for the construction of, for example, a speech synthesis circuit utilizing linear predictive coding over prior art circuits. This invention provides a novel structure and method which minimizes error components in the synthesized speech signal due to voltage errors inherent in the use of analog sample and hold circuits which are used to store the forward and backward prediction errors utilized in the linear predictive coding technique. Using the method of this invention, the inherent error components are alternatively inverted and not inverted upon each clock cycle of the multiplier/adder. Thus imposing a frequency of one-half the clock rate upon the error components. These error components are then removed using a notch filter which removes signals having a frequency of one-half the clock rate.

4 Claims, 14 Drawing Figures

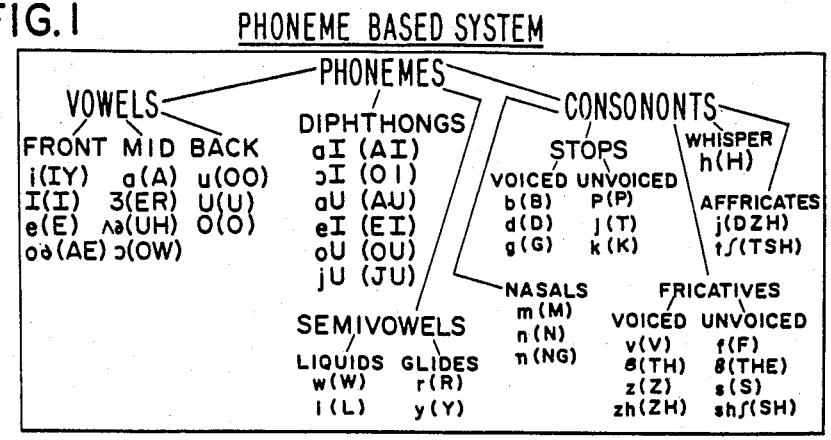
FIG. 1 PHONEME BASED SYSTEM
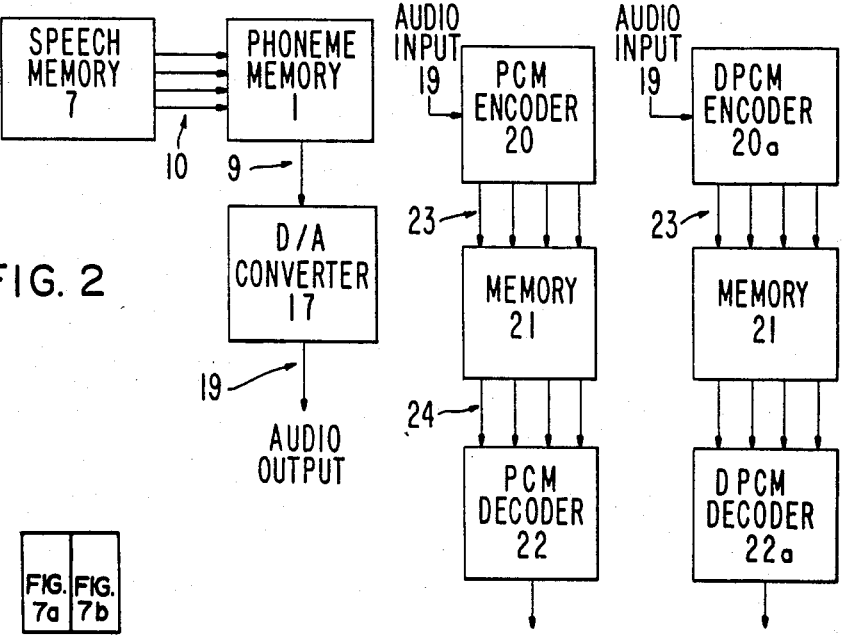
FIG. 2
FIG. 3
FIG. 4
FIG. 7d

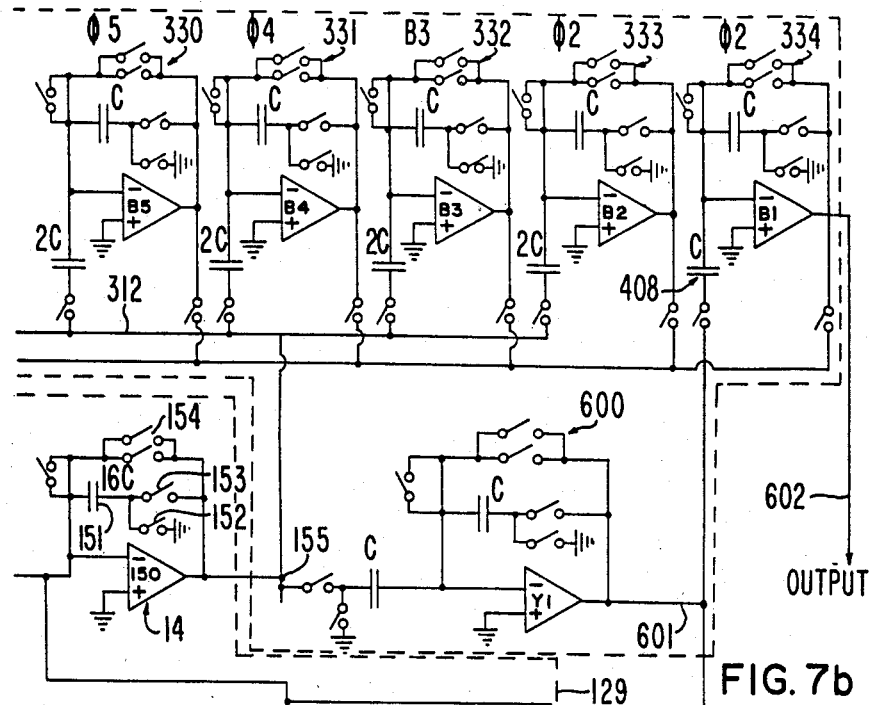
FIG. 7b
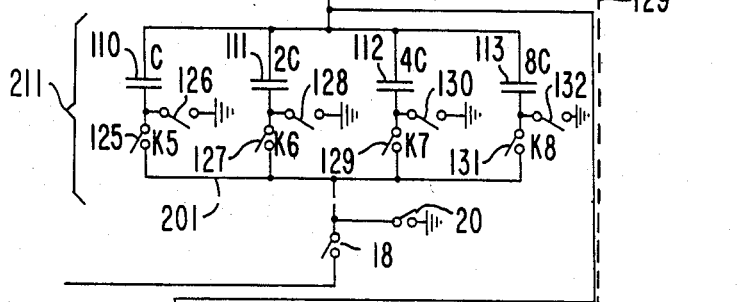
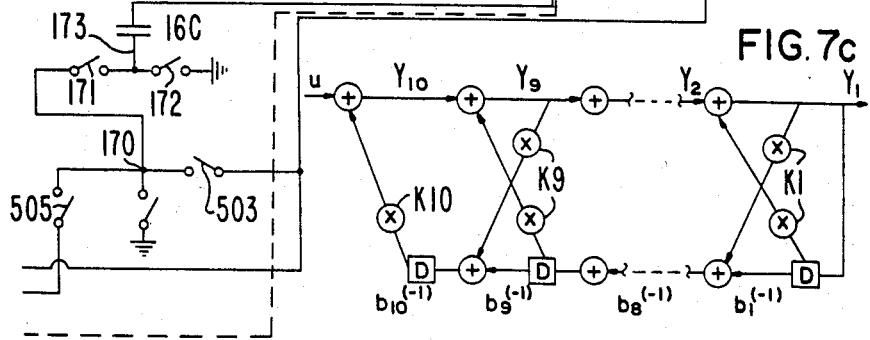
FIG. 7c

MULTIPLIER/ADDER CIRCUIT

BACKGROUND OF THE INVENTION

1. Field of the Invention

This invention relates to structures and methods for simultaneously multiplying and adding a plurality of signals. This specification describes such a multiplier/adder circuit in the context of artificially synthesizing human speech.

2. Description of the Prior Art

Multiplier/adder circuits are known in the prior art. A typical multiplier/adder circuit of the prior art is a relatively complicated structure requiring the use of a substantial amount of semiconductor material in its fabrication. One particular use for such circuits is in the synthesis of speech utilizing linear predictive coding techniques. A number of techniques exist for synthesizing speech. One technique for synthesizing speech is the phoneme based system. The phoneme based system is based on the principle that most languages can be described in terms of a set of distinctive sounds, or phonemes. For American English, there are approximately 42 phonemes, as shown in FIG. 1. The 42 phonemes for American English are broken down into four broad classes (vowels, diphthongs, semi-vowels, and consonants), and these four broad phoneme classes are broken down into subclasses as shown in FIG. 1. A simplified block diagram for a phoneme based speech synthesis circuit is shown in FIG. 2. The digital representation of each of the phonemes is stored in phoneme memory 1. Speech memory 7 contains the address locations of the phonemes contained in phoneme memory 1, such that phonemes are selected in sequence from phoneme memory 1, thus providing a phoneme string corresponding to the speech to be synthesized. Address locations stored in speech memory 7 are applied via address bus 10 to phoneme memory 1, thus providing an output phoneme string from phoneme memory 1 to digital-to-analog converter 17 through phoneme bus 9. Digital-to-analog converter 17 then converts the digital representation of the phonemes to an analog form which may be applied to other circuitry or a suitable audio transducer (not shown) by output lead 19.

The major disadvantage of the phoneme based speech synthesis system is that the synthesized speech is robotlike, of a very poor quality, difficult to understand and unpleasant and tiring to listen to. An improvement on the phoneme bsed system utilizes 600 sub-phonemes, thus resulting in better quality than the pure phoneme based system, although the quality of a sub-phoneme based system is still relatively poor.

Another method of artificially synthesizing speech is to simply pulse code modulate a speech signal, and store the pulse code modulated representation in a memory. Such a scheme is shown in the block diagram of FIG. 3. An audio input signal is applied via audio input 19 to pulse code modulation encoder 20. The digital representation of the audio input signal is input to memory 21 from PCM encoder 20 via bus 23. When the speech stored in memory 21 is desired to be synthesized, appropriate addressing circuitry (not shown) causes the digital representation of the speech stored in memory 21 to be output to PCM decoder 22 via output bus 24. PCM decoder 22 then converts this digital representation back into an analog speech signal available at audio output 25.

One disadvantage with using a pulse code modulation scheme, as shown in FIG. 3, for synthesizing speech is that an enormous memory 21 is required for even a modest amount of speech synthesis. For example, assuming a sampling rate of 5 kilohertz, and utilizing 8-bit digital bytes, the bit rate of the pulse code modulation speech synthesis system of FIG. 3 would be 40 kilobits per second. Thus, for 25 seconds of synthesized speech, a rather modest amount, memory 21 must be capable of storing 1,000,000 bits. This large amount of memory required makes pulse code modulation speech synthesis systems impractical for most uses.

Another method of speech synthesis is called differential pulse code modulation (DPCM) or linear delta modulation. A block diagram of a speech synthesis circuit employing differential pulse code modulation is shown in FIG. 4. This system is identical to the pulse code modulation system of FIG. 3, with the exception that pulse code modulation encoder 20 is replaced with differential pulse code modulation encoder 20a, and pulse code modulation decoder 22 is replaced with differential pulse code modulation decoder 22a. A pulse code modulation encoder will convert an audio input sample to a digital representation of the magnitude of the sample voltage. Similarly, a pulse code modulation decoder will take a digital representation and convert it to an analog voltage level. On the other hand, a differential pulse code modulation encoder will cause the amplitude difference between the present sample and the next previous sample to be converted to a digital representation. This digital representation of the amplitude differential between the sampled amplitude and the next previously sampled amplitude is stored in memory 21. A differential pulse code modulation decoder will convert the differential pulse code modulated bytes stored in memory 21 to an analog signal available at audio output 25 which replicates the audio input signal applied to differential pulse code modulation encoder 20 via audio input 19.

Adaptive quantization methods utilize non-linear quantization steps during the encoding and decoding process. In analog speech signals, non-uniform quantizers may be used to allow greater precision over small amplitude changes than over large amplitude changes. For an adaptive differential pulse code modulation (ADPCM) speech synthesis system resulting in the same quality speech synthesis as a pulse code modulation method utilizing a 40 kilobit per second bit rate, a bit rate of only 24 kilobits per second is required. Thus, the same 25 seconds worth of speech synthesis will require only 600,000 bits utilizing an ADPCM system, compared with the 1,000,000 bits required by the PCM system.

Yet another method of coding and synthesizing speech is known as linear predictive coding (LPC). This method has become the predominant technique for estimating the basic apectral parameters of speech, vocal tract area functions, and for representing speech for low bit rate transmission or storage. LPC is capable of providing extremely accurate estimates of the speech parameters, and is capable of rapid computation of these estimates. LPC is based on the fact that speech samples can be approximated as a linear combination of past speech samples. By minimizing the sum of the square differences over a finite interval, between the actual speech samples and the predicted ones, a unique set of predictor coefficients can be determined. The predictor coefficients serve as the weighting coefficients used in the linear combination. One of the great advantages in using linear predictive coding to artifically synthesize speech is that the bit rate required for reliably synthesizing high quality speech is much lower than with many other methods of speech synthesis. For example, a system utilizing linear predictive coding to synthesize speech having quality equal to or greater than the PCM or ADPCM methods mentioned above requires a bit rate of only 2.4 kilobits per second. Thus, for the same 25 seconds worth of synthesized speech, the LPC method requires only 60,000 bits of storage. This is a ten-fold improvement in the storage requirements of a speech synthesis system utilizing adaptive differential pulse code modulation, and a greater than fifteen-fold improvement over the storage requirements of a speech synthesis system utilizing pulse code modulation. For this reason, linear predictive coding is widely used in speech synthesis systems where a minimization of required memory, and thus cost, is desired.

Such a speech synthesis integrated circuit device utilizing linear predictive coding is described in U.S. Pat. No. 4,209,836 issued June 24, 1980 to Wiggins, et al. A primary disadvantage in prior art speech synthesis circuits utilizing linear predictive coding, including the Wiggins circuit, is the relatively large area required by the integrated circuit. For example, the integrated circuit device of the Wiggins patent measures approximately 210 mils (0.210 inches) by 214 mils (0.214 inches), thus consumming approximately 45,000 square mils. By integrated circuit standards, this is a very large chip, even though it is fabricated utilizing a P-channel MOS process, which is capable of producing rather compact integrated circuits. Specifically, Wiggins' array multiplier 401, which performs digital multiplications, measures approximately 90 mils by 110 mils, for a total area of approximately 10,000 square mils. Further, Wiggins' digital-to-analog converter 426, which converts the digital output of array multiplier 401, measures approximately 40 mils by 60 mils, thus requiring a chip area of approximately 2,500 square mils. Thus, approximately ¼ of Wiggins' prior art circuit is consummed by array multiplier 401 and digital-to-analog converter 426. Due to the rather large size of Wiggins' integrated circuit, no on-chip memory is provided by Wiggins to store digital representations of speech to be synthesized. Thus, the Wiggins circuit requires an external memory for this purpose.

Other prior art circuits used, for example, for the artificial synthesis of speech also utilize binary multipliers which require rather large semiconductor chip areas, thus increasing their cost and requiring external components. Such binary multipliers are described, for example, by Bartee in the book entitled, "Digital Computer Fundamentals", published by McGraw-Hill, 1972 edition, and the book by Rabiner and Gold entitled, "Theory and Application of Digital Signal Processing", published by PrenticeHall, 1975.

SUMMARY

In one embodiment of this invention a uniquely designed switched capacitor multiplier/adder is provided which is combined with a digital-to-analog converter in a single subcircuit. The multiplier/adder, in a single operation, multiplies an analog voltage by a coefficient, typically binary, and sums this product with a second analog voltage. The use of this unique subcircuit results in a significant reduction in space requirements for the construction of, for example, a speech synthesis circuit utilizing linear predictive coding over prior art circuits.

This invention provides a novel structure and method which minimizes error components in the synthesized speech signal due to voltage errors inherent in the use of analog sample and hold circuits which are used to store the forward and backward prediction errors utilized in the linear predictive filter. Using the method of this invention, the inherent error components are alternatively inverted and not inverted upon each clock cycle of the multiplier/adder. Thus imposing a frequency of one-half the clock rate upon the error components. These error components are then removed using a notch filter which removes signals having a frequency of one-half the clock rate.

BRIEF DESCRIPTION OF THE DRAWINGS

FIG. 1 is a diagram showing the relationship between the 42 phonemes of American English.

FIG. 2 is a block diagram of a prior art phoneme based speech synthesis circuit.

FIG. 3 is a block diagram of a prior art speech synthesis circuit utilizing pulse code modulation.

FIG. 4 is a block diagram of a prior art speech synthesis circuit utilizing differential pulse code modulation.

FIGS. 7a and 7b form a schematic diagram of analog multiplier/adder 129 and analog delay register 130.

FIG. 7c is a mathematical model of the operation of the multiplier/adder of this invention to perform the operations indicated in table 1.

FIG. 7d depicts the physical relationship between FIGS. 7a and 7b.

DETAILED DESCRIPTION

While the description given below is specifically tailored to the use of the multiplier/adder circuit and error elimination method of this invention in conjunction with a speech synthesizer circuit, it is to be understood that the use of this invention is not so limited.

SYSTEM OVERVIEW

Figure 5:
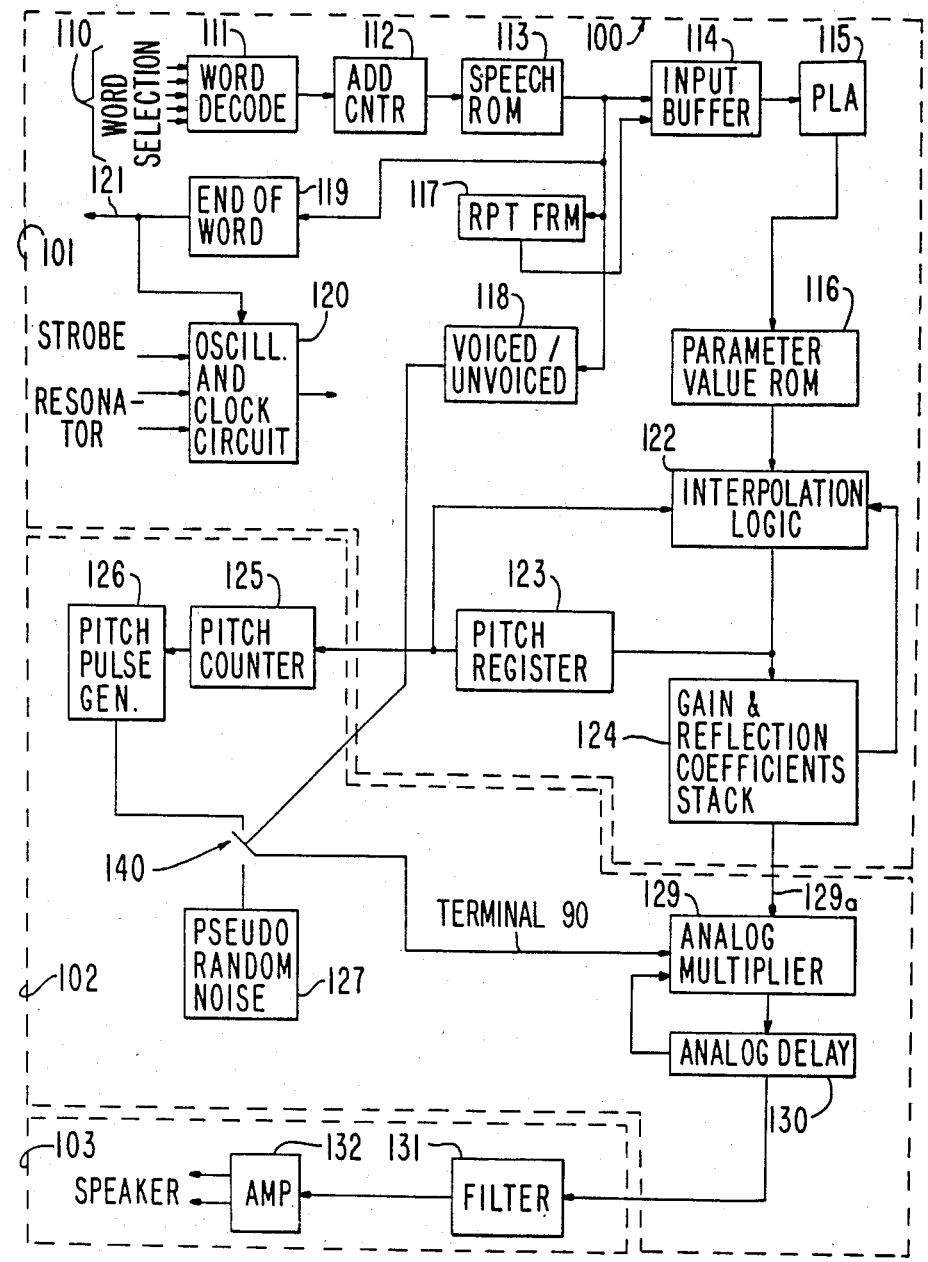
FIG. 5 is a block diagram of the speech synthesis circuit of this invention using the multiplier/adder circuit of this invention.

A block diagram of the speech synthesis system and the multiplier/adder 129 of this invention is shown in FIG. 5. Speech synthesis system 100 comprises front end subsection 101, linear prediction coding (hereinafter "LPC") filter subsection 102 and back-end subsection 103.

FRONT END SUBSECTION 101

To understand the operation of the multiplier/adder 129 of this invention, the operation of the speech synthesizer system 100, in which multiplier/adder 129 operates in one embodiment, will be described briefly.

In the operation of speech synthesizer system 100, a desired word is selected by addressing word decode memory 111 via word selection port 110. Word decode memory 111 contains the start address of the coded representation (preferably a digital code is used) of the to-be-synthesized word which is contained in speech data ROM 113. The beginning address location from word decode memory 111 is used to preset address counter 112, which in turn addresses speech data ROM 113. Address counter 112 then increments the address location applied to speech data ROM 113 in order that each digital byte representing the stored word may be accessed from speech data ROM 113 in sequence. Word decode memory 111, address counter 112 and speech data ROM 113 are all well-known in the prior art, and hence will not be discussed in detail here.

Speech data ROM 113 contains information relating to the parameters required to control the ten stage LPC filter 102. This data is encoded into a packed format (see the section of this specification labelled "Frame Format", infra). Information from bytes accessed from speech ROM 113 is applied to voiced/unvoiced decoder 118, which in turn activates switch means 140. The frame format, providing a detailed explanation of the information stored in speech ROM 113, is later discussed under the subheading "Frame Format". The operation of switch 140, contained within LPC filter 102, is described in detail later under the subheading "LPC Filter Subsection". Information from speech data ROM 113 is also used by repeat frame decoder 117 (refer to "Frame Format" subheading) to determine if the information from speech ROM 113 used in a given frame, is to be resued in the next frame.

Information from speech data ROM 113 is fed to input buffer 114. In one preferred embodiment, speech data ROM 113 is capable of outputting an 8-bit byte; in other words, speech data ROM 113 has an 8-bit parallel output signal. Input buffer 114 is a one word by 40 bit shift register. Each fram may contain eight (8), twenty-four (24) or forty (40) bits. Input buffer 114 is used to convert a plurality of 8-bit bytes from speech ROM 113 into a single frame, of 8, 24 or 40 bits in length. The use of a shift register to serve as an input buffer in this manner is well-known in the prior art, and thus will not be discussed at length.

Parameter value ROM 116 contains the coefficients used in the synthesis of speech utilizing the linear predictive coding techniques. These coefficients are derived in a manner well-known in the art as taught, for example, by Rabiner & Schafer in their book entitled, "Digital Processing of Speech Signals" published by PrenticeHall, Inc., 1978 and particularly that section beginning on page 396 thereof.

Programable logic array 115 controls the bit allocation among the various coefficients within the frame, thus providing optimum storage within speech ROM 113. (See "Frame Format".) It also contains address instructions allowing the sequential selection of parameters from the parameter value ROM 116.

Figure 6:
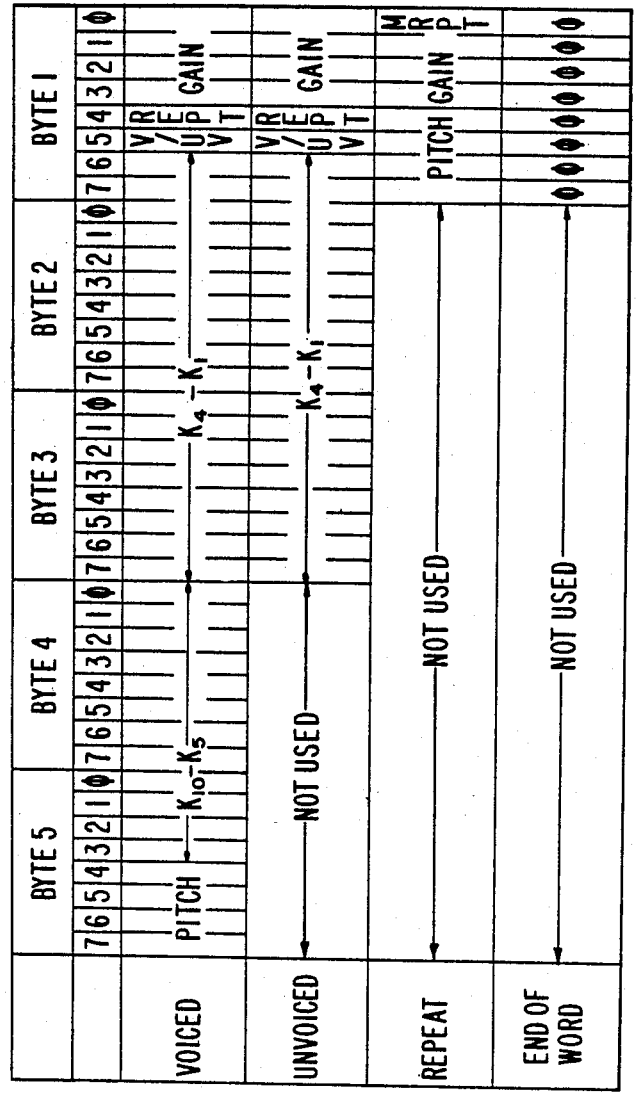
FIG. 6 is a representation of the formats of each of the four types of data frames utilized by this invention.

End of word decoder 119 utilizes information from speech ROM 113 to determine when the last frame of the to-be-synthesized word is received from speech ROM 113. As shown in FIG. 6, the end of word frame contains logical zeroes in each of the eight bits forming byte 1. End of word decoder 119 then signals oscillator and clock circuit 120, and suitable power-down circuitry (via lead 121) to power-down speech synthesizer 100 during periods when speech is not to be synthesized.

Parameters value ROM 116 is used as a look-up table to decode the data stored in speech data ROM 113. The parameters stored in ROM 116 are the non-linearly quantized values of the LPC coefficients, gain and pitch information. The quantized values stored in ROM 116 are selected for storage by a special quantization program run on a sample of speech representation of the individual speaker. See, for an explanation of the manner in which these quantized values are selected the article entitled "Quantization and Bit Collection in Speech Processing", A. A. Gray, Jr. and J. D. Markel, IEEE Transactions on Acoustics, Speech and Signal Processing, Vol. ASSP-24, No. 6, Dec. 1976. The particular quantized values stored in ROM 116 to be used to reproduce a desired speech are controlled by the output signals from speech ROM 113.

Interpolation logic 122 provides a plurality of interpolated values derived from the particular parameter values stored in ROM 116 and selected for use by the output signals from speech ROM 113. The plurality of interpolated values are obtained during the time periods between the reception of sequential frames from parameter value ROM 116. By providing a plurality of interpolated values, the parameter update rate of speech synthesizer 100 may be increased to $N+1$ times the frame rate, where N is the number of interpolation intervals between two frames. The use of speech information generated by interpolation logic 122 results in a more natural sounding output, with a resultant decrease in the bit rate, and thus a reduced memory size required for the storage of frames.

Pitch register 123 stores the current pitch period to be used by pitch counter 125. This pitch period is updated once during each interpolation period by information received from interpolation logic 122. The pitch period determines the period, and thus the frequency or "pitch" of the voiced signal source provided by pitch pulse generator 126.

Gain and reflection coefficients stack 124 is a memory stack of well-known design, which stores the current gain and reflection coefficient values, $K_1$ through $K_{10}$. The stack recirculates the data through LPC filter 102 at the rate of one cycle per sampling period. The data is updated in the stack once every interpolation period.

LPC FILTER SUBSECTION

As a feature of this invention analog multiplier/adder 129 multiplies analog information from analog delay 130 with binary information stored in gain and reflection coefficient stack 124. To this product, analog multipler/adder 129 adds analog information from switch means 140 according to the schedule shown in Table 1.

Pitch counter 125 receives information from pitch register 123, and drives pitch pulse generator 126 at the appropriate frequency, or "pitch".

Pseudo-random generator 127 is the signal source for unvoiced speech (fricatives and sibilants), and comprises an N bit linear code generator with a period of $2^N$ sampling periods (N being an integer normally greater than 12). The output of pseudo-random noise generator 127 is used as a constant amplitude, random sign, source to simulate the unvoiced speech source. In one preferred embodiment of this invention, N is equal to 15; thus pseudo-random noise generator 127 has a period of 32,767 sampling periods (409.6 msec when the sampling period is equal to 125 microseconds);

Switch means 140, controlled by voiced/unvoiced decoder 118, causes either the output of pitch pulse generator 126, or alternatively the pseudo-random noise output from pseudo-random noise generator 127, to be applied to the input of analog multiplier 129.

BACKEND SUBSECTION 103

The output of analog multiplier 129 is fed to filter 131, thus providing amplifier 132 with a synthesized speech signal that is substantially free from the effects of aliasing. The output signal from analog multiplier/adder 129 is sampled at 8 KHz, and consequently its spectrum is rich in aliasing (foldover) distortion components above 4 KHz, as well as Sin X/X attenuation. The signal is filtered by passing it through a 4 KHz low pass filter with Sin X/X compensation sampled at 160 KHz (filter 131). The Sin X/X compensation provided by filter 131 emphasizes the frequency components of the output of analog multiplier/adder 129 which are attenuated by the Sin X/X deemphasis of multiplier/adder 129. The spectrum of the output signal from filter 131 contains no aliasing distortion components below 156 KHz, making the output suitable for feeding directly into a loudspeaker after amplification. In one preferred embodiment, this filter is also realized using switched-capacitor filter technology.

The output from filter 131 is fed to the input of amplifier 132. Amplifier 132, of well-known design provides suitable amplification for driving a speaker or other desired circuitry (not shown).

FRAME FORMAT

The frame format for each of the four types of frames is shown in FIG. 6. A voiced frame comprises 40 bits, which are extracted from speech ROM 113 of FIG. 5 in five bytes, each byte comprising 8 bits. As shown in FIG. 6, byte 1 comprises 4 bits (bits 0 through 3) indicative of the gain factor of the frame. Bit 4 contains information indicative that portions of this frame will be repeated for use in the next frame. Bit 5 contains information indicative of whether this frame is a voiced or unvoiced frame. Bit 5 is fed to voiced/unvoiced decoder 118, as previously described. Bits 6 and 7 of byte 1, bits 0-7 of byte 2, and bits 0-7 of byte 3, comprise coefficients $K_1$-$K_4$. Bits 0-7 of byte 4 and bits 0-3 of byte 5 comprise coefficients $K_5$-$K_{10}$. Coefficients $K_1$-$K_{10}$ are of variable length; the length of each coefficient $K_1$-$K_{10}$ in each fame is determined by information stored within programmable logic array 115. Bits 4-7 of byte 5 contain the four bits indicative of the pitch of the frame.

The unvoiced frame, as shown in FIG. 6, requires only three bytes of information. Because it is an unvoiced frame, the pitch information is not required, in that pseudo-random noise, rather than a specific pulse, is used as the analog input signal. Similarly, only four reflection coefficients ($K_1$-$K_4$) are required for good speech quality. The unvoiced coefficients $K_1$-$K_4$ are also of variable length, as determined by PLA 115.

The repeat type of frame requires only a single byte of information. In the repeat frame, a single bit (bit 0) indicative of multiple repetitions of the frame, the three bit gain information, and the four bit pitch information are provided. However, the voiced/unvoiced information, as well as coefficients $K_1$ through $K_{10}$ are not provided, because this information is identical with the immediately prior frame. In this manner, 80% of the information required to generate a repeat frame is provided by input buffer shift register 114 from the information stored to generate the previous frame. The repeat frame is used when information in a given frame does not differ (as measured as distortion of the speech waveform) by a significant amount from the previous frame. In this manner, the size of speech ROM 113 may be decreased over that which would be required by speech synthesis systems which do not utilize a repeat frame.

The end of word frame comprises a single, unique byte, comprised of 8 bits each having the value zero. This unique byte is detected by end of word decoder 119 of FIG. 5, and is used to indicate that the word being synthesized is complete. An output signal from end of word decoder 119 is used to prompt another circuit to choose the next word to be synthesized, and/or to power-down the speech synthesis system.

MULTIPLIER/ADDER

Figure 7A:
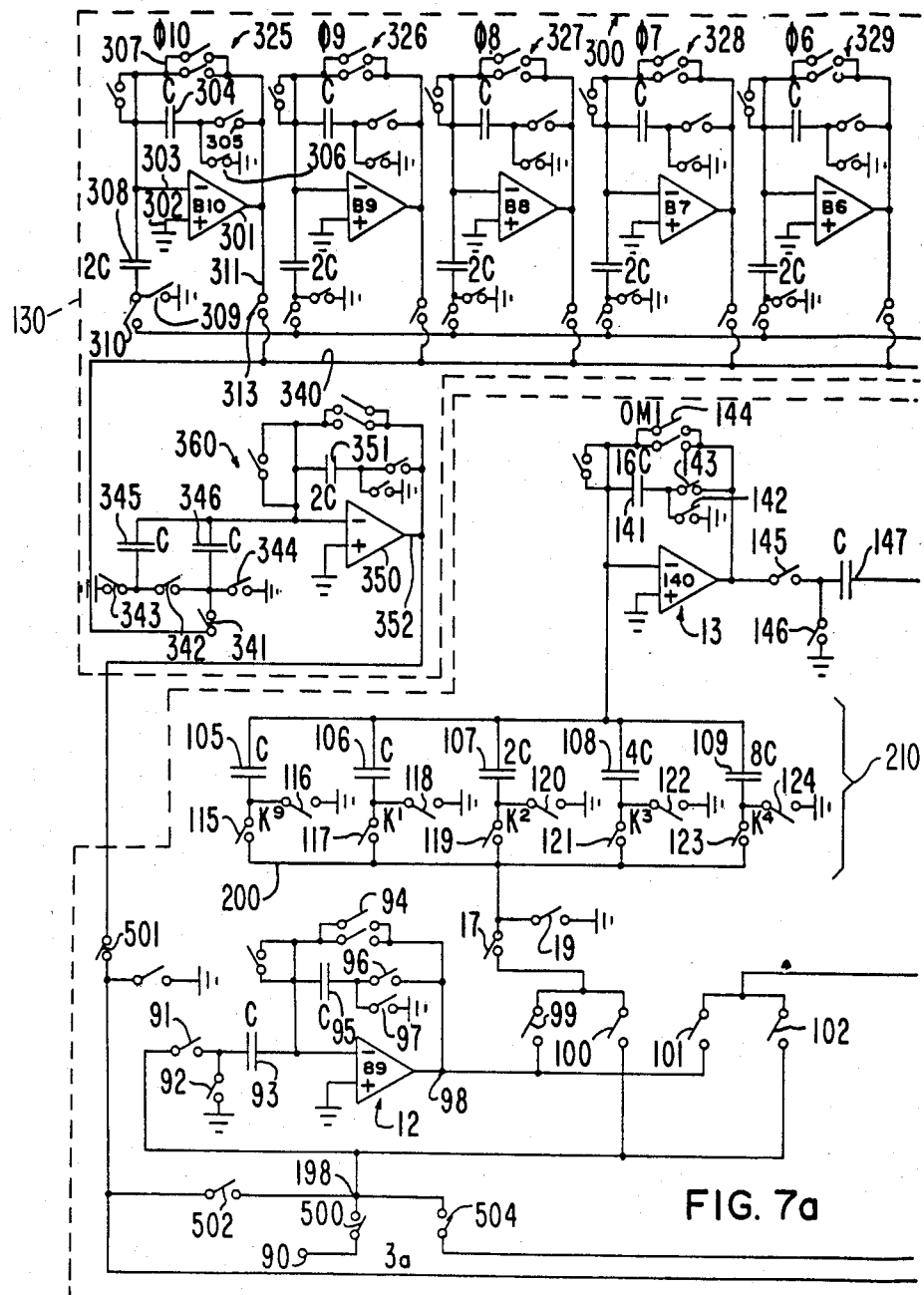

A schematic diagram of the unique multiplier/adder circuit 129 of this invention is shown in FIGS. 7a and 7b. Utilizing this multiplier/adder, an analog voltage is multiplied by a binary coefficient, and added to a second analog voltage, if desired. This structure results in a circuit which is significantly smaller than prior art type binary multiplier and adder circuits.

In many instances, it is desired to provide an analog output voltage which is equal to the product of a binary coefficient and an analog voltage summed with a second analog voltage. This may be expressed as shown in Equation (1):

$$V_{out} = KV_{in1} + V_{in2} \qquad (1)$$

where:
$V_{out}$ = output voltage from multiplier/adder
K = multiplier coefficient
$V_{in1}$ = analog voltage to be multiplied
$V_{in2}$ = analog voltage to be added If the analog input voltages vary over time, they may be sampled, and the operation of Equation (1) performed during each sample interval. The operation of a sample and hold circuit having the design of sample and hold circuits such as circuits 12, 13, and 14 of the circuit of FIGS. 7a and 7b is disclosed in a co-pending patent application Ser. No. 06/239,945 filed Mar. 3, 1981, and assigned to the assignee of this invention, and hence will not be discussed in detail here. The specification and disclosure of this co-pending application are explicitly incorporated herein by reference.

To implement the novel multiplier/adder of this invention the input voltage to be multiplied, $V_{in1}$, is applied to terminal 90 (FIG. 7a). Capacitors 93 and 95 of sample and hold circuit 12, having equivalent capacitance values, provide a voltage equal to $-V_{in1}$ at node 98 during each hold period. A voltage equal to $V_{in1}$ is available at node 198. K is the digital representation of the coefficient to be multiplied and is made available on bus 129a (capable of transmitting nine (9) bits in parallel) to multiplier/adder 129 from gain and reflection coefficients stack 124. If the sign of the product ($KV_{in1}$) in Equation (1) is positive, switches 99 and 102 close, thus causing $-V_{in1}$ to be applied to bus 200 through closed switch 17, and $V_{in1}$ to be applied to bus 201 through closed switch 18. In a similar manner, if the sign of $KV_{in1}$ is negative, switches 100 and 101 close, thus causing $V_{in1}$ to be applied to bus 200, and $-V_{in1}$ to be applied to bus 201.

Capacitor array 211 is comprised of binary weighted capacitors 110 through 113. Capacitor 110 has a capacitance value of C, capacitor 111 has a capacitance value of 2C, capacitor 112 has a capacitance value of 4C, and capacitor 113 has a capacitance value of 8C. In a similar manner, capacitor array 210 is comprised of binary weighted capacitors 106 through 109. Capacitor array 210 also includes capacitor 105, having capacitance value C, whose function is explained later. Capacitor 106 has a capacitance value of C, capacitor 107 has a capacitance value of 2C, capacitor 108 has a capacitance value of 4C, and capacitor 109 has a capacitance value of 8C. Each capacitor in capacitor arrays 210 and 211 has associated with it two switches, for example, switches 131 and 132 associated with capacitor 113 and switches 123 and 124 associated with capacitor 109. The switches are controlled in a well-known manner in response to coefficient K provided on bus 129a and appropriate timing signals. All switches utilized in this invention may be of any suitable type as is well-known in the art, and are preferably metal oxide silicon (MOS) transistors or complementary metal oxide silicon (CMOS) transistors.

Switches 131 and 132 permit one side of capacitor 113 to be connected to either ground, or alternatively to bus 201, which in turn is connected to either $V_{in1}$, or $-V_{in1}$. Switch 132 closes and switch 131 opens, thus connecting capacitor 113 to ground, if $k^7$, the most significant bit of multiplier coefficient K is a "0"; switch 131 closes and switch 132 opens, thus connecting capacitor 113 to bus 201, if $k^7$, the "128s" bit, is a "1". In a similar fashion, the "64s" bit ($k^6$) of multiplier coefficient K controls the action of switches 129 and 130, and thus whether capacitor 112 will be connected to ground or bus 201. Similarly, the "32s" bit ($k^5$) of coefficient K controls switches 127 and 128 associated with capacitor 111, and the "16s" bit ($k^4$) of coefficient K controls the operation of switches 125 and 126 associated with capacitor 110. In this manner, the four most significant bits of multiplier coefficient K control the operation of capacitor array 211. In a similar manner, the four least significant bits ($k^0$-$k^3$) of multiplier coefficient K control the operation of capacitor array 210. The "8s" bit ($k^3$) controls switches 123 and 124 associated with capacitor 109; the "4s" bit ($k^2$) controls switches 121 and 122 associated with capacitor 108; the "2s" bit ($k^1$) controls switches 119 and 120 associated with capacitor 107; and the "1s" bit ($k^0$) controls switches 117 and 118 associated with capacitor 106.

The additional capacitor 105 (having capacitance value C) in capacitor array 210, with its associated switches 115 and 116 (controlled by the sign bit $k^8$) has a contribution which is equal to the contribution of the least significant bit of the coefficient K. The purpose of capacitor 105 is to aid in conversion of the value of the coefficient K from "2s" complement presentation to sign magnitude as will be explained below. Switch 116 is closed, and switch 115 is open when the sign bit ($k^8$) of K is positive. Similarly, switch 115 is closed, and switch 116 is open, when the sign bit of K is negative.

During the sampling period, switches 142 and 144 is closed, and capacitors 106, 107, 108 and 109 will be charged. For example, when the least significant bit ($k^0$) of multiplier coefficient K controlling capacitor 106 is a "1", switch 117 of capacitor array 210 is closed (and switch 118 is open) during the sampling period of sample and hold subcircuit 13. Ignoring the inherent offset voltage of operational amplifier 140, this causes capacitor 106 to charge to $V_{in1}$. Capacitor 106 thus stores a charge of $CV_{in1}$. On the other hand, if the least significant bit of multiplier coefficient K associated with capacitor 106 is a "0", switch 118 remains closed, thus preventing capacitor 106 from charging. In a similar fashion, capacitor 107 stores either no charge, if its multiplier coefficient bit is a "0", or $2CV_{in1}$ if its multiplier coefficient bit is a "1"; capacitor 108 stores a charge equal to either "0" or $4CV_{in1}$; and capacitor 109 stores a charge of either "0" or $8CV_{in1}$.

After this sampling period, switches 144 and 142 open, and switch 143 closes. Switch 17 opens, and switch 19 closes, thus connecting bus 200 to ground. Since the inverting input of operational amplifier 140 is essentially at ground (since the noninverting input is connected to ground), capacitors 105 through 109 will discharge, with their stored charge being applied to capacitor 141, having capacitance value 16C. The output voltage of operational amplifier 140, $V_{out}'$ is given in Equation (2).

$$V_{out}' = \frac{V_{in1} \, k^{0-3}}{16} + \frac{V_{in1} \, k^8}{16} \qquad (2)$$

where $k^{0-3}$ = The decimal equivalent of a four bit binary number comprised of the four least significant bits of eight bit multiplier coefficient K, representing the $2^0$, $2^1$, $2^2$ and $2^3$ places. Thus, for example, if K=10011101, $k^{0-3}$ will be equal to 13, the decmal equivalent of $(1101)_2$.

$k^8$ = The sign bit of the K coefficient.

Simultaneous with the actions just described taking place in capacitor array 210 and sample and hold subcircuit 13, similar actions are taking place in capacitor array 211 and sample and hold subcircuit 14. Capacitor array 211 is charged to an integral multiple of $CV_{in1}$, as determined by the four most significant bits ($k^{4-7}$) of multiplier coefficient K. This charge contained in capacitor array 211, together with the charge stored in capacitor 173 having capacitance value 16C (due to the presence of a to-be-added analog voltage $V_{in2}$) are then discharged into capacitor 151 of sample and hold subcircuit 14. At the same time, capacitor 147 (having capacitance value C) is charged to $V_{out}'$. This results in the output voltage available at terminal 155 $V_{out}$, as given in Equation (3).

$$V_{out} = \frac{-V_{out}'}{16} - \left[ \frac{k^{4-7}}{16} \right] V_{in1} - \frac{16}{16} V_{in2}; \text{ or} \qquad (3)$$

$$V_{out} = -V_{in1} \left[ \frac{k^{0-3}}{256} + \frac{k^{4-7}}{16} + \frac{k^8}{256} \right] - V_{in2}$$

where $K^{4-7}$ = The decimal equivalent of a four bit binary number comprised of the four most significant bits of eight bit multiplier coefficient K, representing the $2^4$, $2^5$, $2^6$ and $2^7$ places. Thus, for example, if K=10011101, $k^{4-7}$ will be equal to 9, the decimal equivalent of $(1001)_2$.

$k^8$ = The sign bit of the K coefficient.

Ignoring for the moment the contribution of $k^8$ in Equation 3, one can see that for the example given above, Equation 3 will yield:

$$V_{out} = -V_{in1} \left[ \frac{13}{256} + \frac{9}{16} \right] - V_{in2} \qquad (4)$$

$$V_{out} = -V_{in1}\left[\frac{157}{256}\right] - V_{in2}$$

This is precisely the fraction received when the number 10011101 is treated as a binary fraction. Thus the unique two stage analog multiplier/adder of this invention delivers the same result with a maximum capacitance ratio of 1 to 16 as would a single stage with a capacitance ratio of 1 to 256. Thus, circuit size is minimized by utilizing two capacitor arrays, each having total capacitance of 15C (ignoring sign-bit capacitor 105) rather than a single capacitor array having total capacitance of 255C. This is a primary advantage of the unique two stage multiplier/adder circuit of this invention.

When even higher accuracy is desired, additional stages may be added in the same manner. Capacitor arrays 210 and 211 may comprise a plurality of N capacitors. For the purposes of this explanation, N has been chosen to equal four. The factors limiting the value of N are operational amplifier accuracy and layout size.

Because the K coefficient is stored in gain and reflection coefficients stack 124 in the "2's complement" form (to simplify addition and subtraction in the interpolator), it is necessary to convert K to the signed magnitude form in analog multiplier/adder 129. This is done by inverting each bit of a negative K parameter and then adding one to the least significant bit. This bit inversion is done in gain and reflection coefficient stack 124. The addition to the least significant bit is accomplished by capacitor $C_{105}$ in the least significant capacitor array 210. Since conversion is required only for negative vlaues of K, $C_{105}$ is controlled by the sign bit $k^8$. Thus, switch 115 is closed (and switch 116 is open) when $k^8$ is negative.

ANALOG STORAGE DELAY REGISTER

Analog delay 130 is shown in FIGS. 7a and 7b. Analog delay 130 is comprised of a plurality of sample and hold circuits. The following discussion of sample and hold circuit 325 applies equally to each sample and hold circuit contained within analog delay 130.

An analog voltage to be stored is received from node 155 connected to operational amplifier 14 of multiplier-/adder 129. Node 155 is connected via lead 312 to one side of switch 310. The other side of switch 310 is connected to a first plate of capacitor 308 (having a capacitance 2C). When a voltage $V_x$ applied to lead 312 is to be stored in sample and hold circuit 325, switch 310 closes, thus charging capacitor 308 to $2CV_x$. Switch 310 then opens and switch 309 closes, thus discharging capacitor 308 into capacitor 304 (having a capacitance value C). This causes a voltage equal to $2V_x$ to be available on output lead 311 of operational amplifier 301. By causing a voltage equal to $2V_x$ to be stored in sample and hold circuit 325, inaccuracies due to leakage currents, and component mismatches are reduced by a factor of two. The LPC coefficients to be stored in sample and hold circuits 325 through 333 correspond to the linear predictive coding speech parameters $B_{10}$ through $B_2$. The analog representations of $B_{10}$ through $B_2$ are always less than one-half of the maximum voltage output of sample and hold circuits 325 through 333; thus this voltage doubling may be performed without the introduction of errors. However, the analog voltage representation of $B_1$, which is to be stored in sample and hold circuit 334, is not always less than one-half of the maximum output voltage capability of sample and hold circuit 334. For this reason, capacitor 408 of sample and hold circuit 334 (which corresponds to capacitor 308 of sample and hold circuit 325) has a capacitance value of C. Thus, the analog voltage corresponding to $B_1$ is stored in sample and hold circuit 334 without being doubled.

The output voltages of sample and hold circuits 325 through 334 are applied as needed to lead 340 (through switch 313, for example, in sample and hold circuit 325). Sample and hold circuit 360 is used to buffer the voltage available on lead 340. Furthermore, sample and hold circuit 360 is used to divide the output voltage from, for example, sample and hold circuit 325, by two, thus providing a voltage on output lead 352 of operational amplifier 350 which is equal to the analog voltage representative of $B_{10}$. This is achieved by utilizing capacitance 346 with capacitance C and capacitor 351 having capacitance 2C. By the selective use of switch 342, capacitor 345 (having a capacitance value C) may be added in parallel with capacitor 346 (also having capacitance C) when buffering the analog voltage representing $B_1$, as stored in sample and hold circuit 334. In this manner, sample and hold circuit 360 acts as a unity gain buffer, thus not dividing by two the analog voltage representing $B_1$. This is necessary because the analog voltage representing $B_1$ was not doubled when it was stored in sample and hold circuit 334.

ITERATIVE OPERATION OF SPEECH SYNTHESIZER USING MULTIPLIER/ADDER CIRCUIT 129

First, a binary representation of the selected word is provided via word selection input 110 of FIG. 5. The data received from word selection input 110 is used to address word decode ROM 111. The output from word decode ROM 111 is the start address of the speech data contained in speech ROM 113 corresponding to the selected word. Address counter 112 is preset to this start address and begins counting. The output of address counter 112 is used as the address input of speech ROM 113. Data from speech ROM 113 is supplied to input buffer 114. The output of speech ROM 113 is also supplied to end of word decoder 119, which determines if the end of the to be synthesized word has been reached. If byte 1 contains all zeroes, indicating the end of the word has been reached, end of word decoder 119 provides an output 121 which either causes the selection of the next word to be input to the speech synthesis system via word selection input 110, or powers down the speech synthesis circuit. The data from speech ROM 113 is also supplied to repeat frame decoder 117, which determines whether data previously stored in input buffer 114 is to be reused. The output data from speech ROM 113 is also supplied to voiced/unvoiced decoder 118, which determines the status of the voiced/unvoiced bit which in turn controls switch means 140. Data from the input buffer 114 is input to programmable logic array (PLA) 115, which separates the data stored in input buffer 114 into a plurality of coefficients, and provides address instructions to parameter value ROM 116 allowing the sequential selection of parameters from a parameter value ROM 116. The parameter value ROM 116 functions as a look-up table and, based on the address instructions received from PLA 115, provides LPC coefficients to interpolation logic 122. Interpolation logic 122 loads gain and reflection coefficient stack 124 with a plurality of interpolated coefficient values. The pitch coefficient is provided by interpolation logic 122 to pitch register 123, which in turn provides pitch counter 125, with data for use in controlling the pitch pulse generator 126. Pitch pulse generator 126 provides a voiced signal having a specified period to switch means 140. Pseudo random noise source 127 provides an unvoiced signal to switch means 140. Switch means 140 provides either a voiced signal from pitch pulse generator 126 (for the generation of voiced data) or pseudo random noise from pseudo random noise source 127 (for the generation of unvoiced data) as the input signal to analog multiplier/adder 129.

The equations representing the iterative process of the speech synthesizer of this invention are given in Table 1. First, reflection coefficient $Y_{11}$ is calculated by multiplying the gain factor G (as stored in gain and reflection coefficients stack 124) by the input voltage U(i). U(i) is either a voiced signal, from pitch pulse generator 126, or pseudo-random noise from pseudo-random noise generator 127 (see FIG. 6). Input voltage U(i) is applied to node 90 (FIGS. 7a and 7b) and through switch 500 to node 198. Positive and negative voltages having magnitudes equal to the input voltage U(i) is then applied to bus 200 of capacitor array 210 and bus 201 of capacitor array 211, as previously described. Gain factor G from gain and reflection coefficients stack 124 (FIG. 5) is applied to switches $k^0$ through $k^9$, thus providing an output from analog multiplier 129 at node 155 which is equal to $$Y_{11}(i) = GU(i) \tag{5}$$

This analog voltage representing $Y_{11}$ is stored in sample and hold circuit 600, in the manner described in co-pending U.S. patent application Ser. No. 06/239,945 filed Mar. 3, 1981.

$Y_{10}$ is then calculated by the following method. $2B_{10}$, as stored in sample and hold circuit 325, is applied to lead 340, and is divided by two by sample and hold circuit 360. Thus, $B_{10}$ is available on output lead 352 of operational amplifier 350. $B_{10}$ is then connected to node 198 through closed switches 501 and 502, and applied to analog multiplier 129 as previously described. Reflection coefficient $K_{10}$ is applied to analog multiplier 129 as previously described, thus controlling the operation of each switch contained within capacitor arrays 210 and 211. $Y_{11}$ as stored in sample and hold circuit 600 and available on output lead 601 is connected node 170 through closed switch 503. Thus, the output from analog multiplier/adder 77 and available at node 155 is $$Y_{10}(i) = Y_{11}(i) - K_{10}B_{10}(i-1) \tag{6}$$

This value of $Y_{10}$ is stored in sample and hold circuit 600, and the previous value $Y_{11}$ stored in sample and hold circuit 600 is lost. $Y_9$ is then calculated by applying $2B_9$, as stored in sample and hold circuit 326, to lead 340, thus providing an output of $B_9$ at output lead 352 of operational amplifier 350. This value of $B_9$ is then applied to node 198 through closed switches 501 and 502, and thus to capacitor arrays 210 and 211. Refection coefficients $K_9$ is used to control the operation of capacitor arrays 210 and 211, and the value of $Y_{10}$ stored in sample and hold circuit 600 is applied through switch 503 to node 170. Thus the output voltage available on node 155 is equal to $$Y_9(i) = Y_{10}(i) - K_9B_9(i-1) \tag{7}$$

The value of $B_{10}$ is then calculated by applying $Y_9$, as stored in sample and hold circuit 600, to node 198 through closed switch 504. $Y_9$ is then applied to capacitor arrays 210 and 211, whose operation is controlled at this time by reflection coefficient $K_9$. The previous value of $2B_9$ is applied from sample and hold circuit 326 to sample and hold circuit 360 (where it is divided by two) and $B_9$ is thus applied through closed switches 501 and 505 to node 170. Thus, the output available at node 155 is equal to $$B_{10}(i) = B_9(i-1) + K_9Y_9(1) \tag{8}$$

This value of $B_{10}$ is then doubled and stored in sample and hold circuit 325 for future use.

The value of $Y_8$ is then calculated by applying $2B_8$, as stored in sample and hold circuit 327, to sample and hold circuit 360, where it is divided by two. $B_8$ is then applied through switches 501 and 502 to node 198. Reflection coefficient $K_8$ is applied to capacitor arrays 210 and 211 to control the operation of the switches contained therein, and the value of $Y_9$, as stored in sample and hold circuit 600, is applied through switch 503 to node 170. Thus, the output voltage available on node 155 is equal to $$Y_8(i) = Y_9(i) - K_8B_8(i-1) \tag{9}$$

Similarly, the operation of this circuit continues in order that values for $Y_1$ through $Y_{11}$, and $B_1$ through $B_{10}$ may be calculated as needed. The output signal of this circuit is a voltage equal to the value of $B_1$, which is available from sample and hold circuit 334 on lead 602. The iterative mathematical process depicted in Table I is then repeated, and a further output signal obtained. After each interpolation performed by interpolation logic 122, a plurality of iterations are performed, thus providing a plurality of output signals. This plurality of output signals forms a portion of the word which is being synthesized. Appropriate circuitry for controlling the operation of the various switches (such as switches 501, 502, 503, 504, 505, 310, and 313) are well-known in the art, and thus are not shown or described in detail.

After a first plurality of interpolations by interpolation logic 22, and a second plurality of iterations and outputs from analog multiplier/adder 129, address counter 112 increments by one, and a new set of data is provided to interpolation logic 122, as previously described. In one preferred embodiment, interpolation logic 122 provides four sets of interpolated values from each set of data input to interpolation logic 122. Multiplier/adder 129 provides forty (40) iterations of the equations of Table I, and thus forty (40) output signals for each set of interpolated values from interpolation logic 122. Thus, a third plurality of output signals (forming portions of the word being synthesized), from multiplier/adder 129 is obtained due to each increment of address counter 112.

ERROR ELIMINATION METHOD

The forward and backward prediction errors are calculated according to the following equations, as previously described with reference to Table 1:

$$Y_j(i) = Y_{j+1}(i) - K_jB_j(i-1) \tag{10}$$

$$B_{j+1}(i) = B_j(i-1) + K_j Y_j(i) \quad (11)$$

Each $B_j(i-1)$ value is stored in its associated sample and hold circuit of analog storage register 300 for a full sample period before it is accessed in the next sample period.

The output speech sample $Y_1(i)$ can be expressed in terms of the backward prediction error $B_j(i)$ terms by eliminating the $Y_j(i)$ terms from the above equations. This results in the following equation:

$$Y_1(i) = GU(i) - \sum_{i=1}^{10} K_j B_j(i-1) \quad (12)$$

where $Y_1(i)$ is the output speech sample, $U(i)$ is the input sample from the excitation source, and G is the gain factor provided by gain and reflection coefficients stack 124, as previously described.

Although, as previously described, the sample and hold circuits of analog storage register 300 (FIG. 7a), sample and hold subcircuits 13 (FIG. 7a) and 14 (FIG. 7b) of multiplier/adder 129, sample and hold circuit 12 (FIG. 7a) and sample and hold circuit 600 (FIG. 7b) are constructed as described in co-pending patent application Ser. No. 06/239,945, filed Mar. 3, 1981, and assigned to American Microsystems, Inc., the assignee of this invention, and accordingly utilize techniques for minimizing the effects of operational amplifier offset voltages, the voltages stored in each of these sample and hold circuits will contain an error component due to effects such as clock feedthrough, junction leakage, etc. Because each of the sample and hold circuits utilized in accordance with this invention is constructed in the same semiconductor substrate utilizing the same processing techniques, these circuits are closely matched and it may be assumed that the error components of the voltages stored within the sample and hold circuits are substantially equal. Thus, the actual $Y'_j(i)$ and $B'_j(i)$ signals available from the sample and hold circuits are defined as:

$$Y'_j(i) = Y_j(i) + \Delta Y_j \quad (13)$$

$$B'_j(i) = B_j(i) + \Delta B_j \quad (14)$$

where $\Delta Y_j$ and $\Delta B_j$ are the error components of $Y'_j(i)$ and $B'_j(i)$, respectively.

Thus, the actual speech sample is defined as $$Y_1(i) = GU(i) - \sum_{j=1}^{10} K_j B_j(i-1) + \sum_{j=2}^{10} \Delta Y_j - \sum_{j=1}^{10} K_j \Delta B_j \quad (15)$$

where the error component $\Delta$ is defined as $$\Delta = \sum_{j=2}^{10} \Delta Y_j - \sum_{j=1}^{10} K_j \Delta B_j \quad (16)$$

Figure 8:
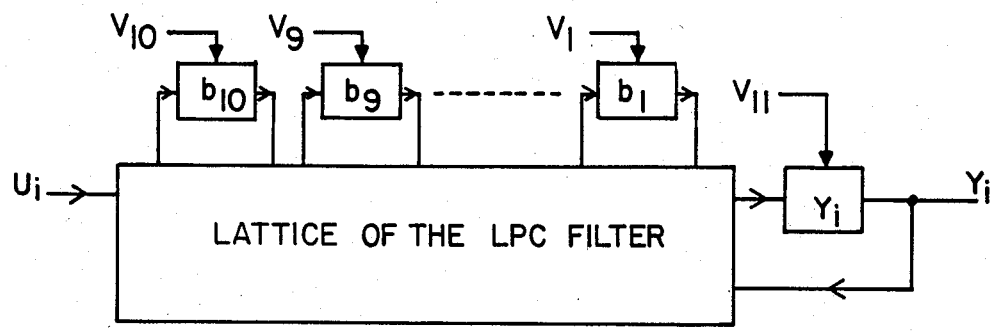
FIG. 8 is a block diagram depicting one embodiment of this invention.

The effect of the error component $\Delta$ on the speech signal is better understood utilizing a frequency domain analysis. FIG. 8 is a block diagram which represents the LPC filter, where $\Delta V_1$ through $\Delta V_{10}$ are the offset voltages associated with backward coefficients $B_1$ through $B_{10}$, respectively. Similarly, $\Delta V_{11}$ is the error voltage associated with the $Y_j(i)$ value.

The transfer function from the input to the output of the filter of FIG. 8 is:

$$H(Z) = \frac{Y_1(Z)}{U(Z)} = \frac{A}{Z^{10} + a_9 Z^9 + a_8 Z^8 + \ldots + a_1 Z + a_0} \quad (17)$$

where $Z = e^{j\omega t}$.

If the input of the filter is set to zero, (i.e., $U(i) = 0$), then the output signal $Y_1(Z)$ due to the offset voltage sources will be $$Y_1(Z) = \sum_{i=1}^{11} V_i(Z) U_i(Z) \quad (18)$$

When each $V_i$ is a DC voltage, $\omega = 0$ and thus $Z = e^{j\omega t} = e^0 = 1$. Thus, the output signal is $$Y_{1error} = \sum_{i=1}^{11} V_i U_i(1) \quad (19)$$

For a time-invariant filter, the input sample $U_i(1)$ is constant and $Y_{1error}$ corresponds to a DC offset voltage. Conversely, for a time variant filter the input sample $U_{i(1)}$ will slowly vary with time and the error signal $Y_{1error}$ includes frequency components in the low frequency region which distort the desired speech signal.

Figure 9:
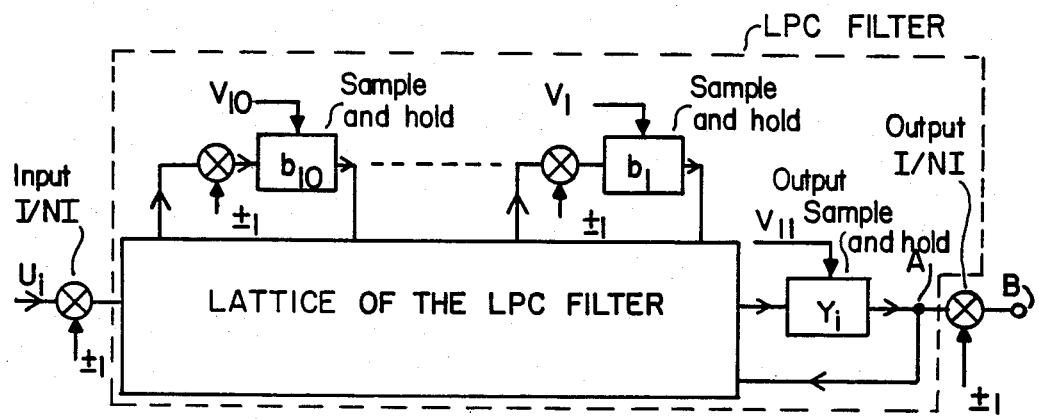
FIG. 9 is a block diagram depicting another embodiment of this invention which utilizes the unique error elimination method of this invention.

One embodiment of this invention is shown in FIG. 9. This embodiment provides for the elimination of this undesirable distortion of the speech signal by translating the error components to a frequency above the desired speech. In the embodiment of FIG. 9, the input signal $U_i$ and the $B_i$ values are multiplied by $+1$ in even numbered clock periods and are multiplied by $-1$ in odd numbered clock periods. The error signals $(V_i)$, however, are not affected and they maintain their polarities and magnitudes. The output signals $Y_1$ for two consecutive clock periods are as follows:

For even numbered clock periods, $$Y_1(i-1) = U(i-1) - \sum_{i=1}^{10} K_j B_j(i-2) + \sum_{j=2}^{10} \Delta Y_j - \sum_{j=1}^{10} K_j \Delta B_j \quad (20)$$

For odd numbered clock periods, $$Y_1(i) = -U(i) + \sum_{j=1}^{10} K_j B_j(i-1) + \sum_{j=2}^{10} Y_j - \sum_{j=1}^{10} K_j \Delta B_j \quad (21)$$

The actual output samples $Y_o(i)$ are obtained from the $Y_1(i)$ values after being multiplied by either $+1$ (even numbered clock periods) or $-1$ (odd numbered clock periods). Thus, for two consecutive clock cycles, $$Y_o(i-1) = Y_1(i-1) = U(i-1) - \sum_{j=1}^{10} K_j B_j(i-2) + \sum_{j=2}^{10} Y_j - \sum_{j=1}^{10} K_j \Delta B_j \quad (22)$$

and $$Y_o(i) = -Y_1(i) = U(i) - \sum_{j=1}^{10} K_j B_j(i-1) - \sum_{j=2}^{10} \Delta Y_j + \sum_{j=1}^{10} K_j \Delta B_j \quad (23)$$

Figure 10A:
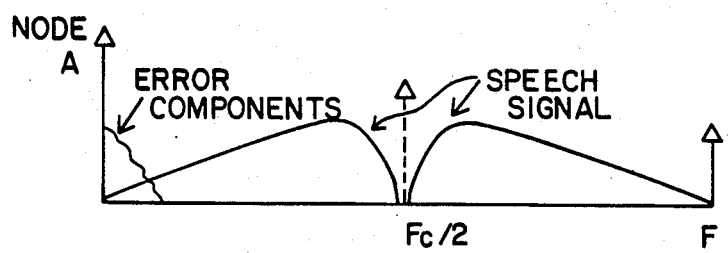
FIGS. 10a and 10b are graphical representations of the operation of the embodiment of FIG. 9.
Figure 10B:
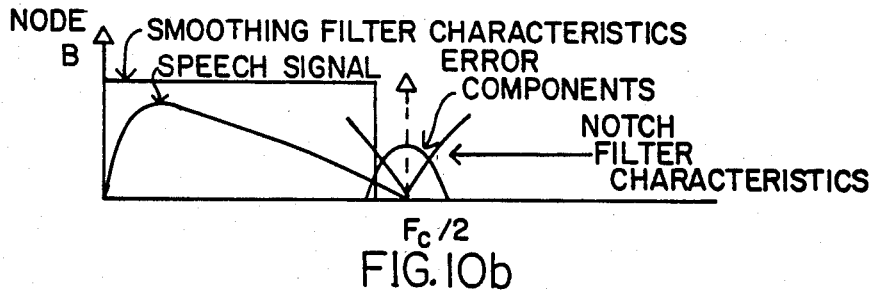

From equations (22) and (23) it is shown that the error components are multiplied by ±1 while the desired speech signal components are unchanged. This means that the error signal components modulate a carrier having frequency $f_c/2$, where $f_c$ is the clock frequency (i.e., $f_c=1/$(clock period)). In one embodiment of this invention, this error signal is rejected by a notch filter (not shown) which is tuned to reject components of the output speech signal centered around $f_c/2$. A frequency domain representation of the speech signal, the error components and the notch filter characteristics are shown in FIGS. 10a and 10b for nodes A and B, respectively, of the structure of FIG. 9.

While this specification describes the use of the analog/multiplier of this invention as an element of a speech processing structure utilizing specific word sizes, components, and formats, it is appreciated that to those skilled in the art a wide variety of embodiments are possible utilizing the teachings of this invention.

TABLE 1

$$Y_{11}(i) = GU(i)$$
$$Y_{10}(i) = Y_{11}(i) - K_{10}B_{10}(i-1)$$
$$Y_9(i) = Y_{10}(i) - K_9B_9(i-1)$$
$$B_{10}(i) = B_9(i-1) + K_9Y_9(i)$$
$$Y_8(i) = Y_9(i) - K_8B_8(i-1)$$
$$B_9(i) = B_8(i-1) + K_8Y_8(i)$$
$$\vdots$$
$$Y_1(i) = Y_2(i) - K_1B_1(i-1)$$
$$B_2(i) = B_1(i-1) + K_1Y_1$$
$$B_1(i) = Y_1(i) = \text{Filter output}$$

We claim:

1. A structure for minimizing error components in the analog output signal of a linear predictive filter which utilizes analog sample and hold circuits to store the forward and backward prediction errors comprising:
   means for providing a clock signal having a plurality of clock periods;
   means for providing an inverted input signal to said filter during odd numbered clock periods and a noninverted input signal to said filter during even numbered clock periods;
   means for storing inverted forward and backward prediction errors in said analog sample and hold circuits during odd numbered clock periods and for storing noninverted forward and backward prediction errors in said analog sample and hold circuits during even numbered clock periods; and
   means for inverting the output signal from said filter during odd numbered clock periods and for not inverting the output signal from said filter during even numbered clock periods, thereby shifting the error signal of said linear predictive filter to a frequency of one-half the frequency of said clock signal.

2. Structure as in claim 1 which further includes a notch filter tuned to one-half the clock frequency which receives as its input signal the output signal from said means for inverting, wherein the output signal of said notch filter is substantially free from error components centered around one-half the clock frequency.

3. A method for minimizing error components in the analog output signal of a linear predictive filter which utilizes analog sample and hold circuits to store the forward and backward prediction errors comprising the steps of:
   providing an inverted input signal to said filter during odd numbered clock periods and a non-inverted input signal to said filter during even numbered clock periods;
   storing inverted forward and backward prediction errors in said analog sample and hold circuits during odd numbered clock periods and storing non-inverted forward and backward prediction errors in said analog sample and hold circuits during even numbered clock periods; and
   inverting the output signal from said filter during odd numbered clock periods and not inverting the output signal from said filter during even numbered clock periods, thereby shifting the error signal of said linear predictive filter to a frequency of one-half the frequency of the clock signal.

4. Method as in claim 3 which further includes the step of filtering the output signal from said filter by the use of a notch filter tuned to one-half the clock frequency which receives as its input signal the output signal from said means inverting, wherein the output signal of said notch filter is substantially free from error components centered around one-half the clock frequency.

* * * * *

UNITED STATES PATENT AND TRADEMARK OFFICE
CERTIFICATE OF CORRECTION

PATENT NO. : 4,521,907
DATED : June 4, 1985
INVENTOR(S) : Gideon Amir, Roubik Gregorian It is certified that error appears in the above—identified patent and that said Letters Patent is hereby corrected as shown below:

Col. 1, line 50, delete "bsed" and substitute --based--;

Col. 5, line 36, delete "fram" and substitute --frame--;
Col. 6, line 55, between "random" and "generator" insert --noise--;
Col. 11, line 38, delete "STORAGE DELAY REGISTER" and substitute --DELAY--;
Col. 13, line 49, between "connected" and "node" insert --to--;
Col. 14, line 29, the equation should read:

$$Y_8(i) = Y_9(i) - K_8 B_8(i-1) \qquad (9)$$

Signed and Sealed this

Twenty-ninth Day of October 1985

[SEAL]

Attest:

DONALD J. QUIGG

Attesting Officer

Commissioner of Patents and Trademarks—Designate